United States Patent
Kast

(10) Patent No.: US 9,995,855 B2
(45) Date of Patent: Jun. 12, 2018

(54) METHOD AND DEVICE FOR PRODUCING A LENS WAFER

(71) Applicant: EV GROUP E. THALLNER GMBH, St. Florian am Inn (AT)

(72) Inventor: Michael Kast, Wels (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 192 days.

(21) Appl. No.: 14/441,658

(22) PCT Filed: Dec. 11, 2012

(86) PCT No.: PCT/EP2012/075015
§ 371 (c)(1),
(2) Date: May 8, 2015

(87) PCT Pub. No.: WO2014/090281
PCT Pub. Date: Jun. 19, 2014

(65) Prior Publication Data
US 2015/0293269 A1    Oct. 15, 2015

(51) Int. Cl.
*B29D 11/00* (2006.01)
*G02B 3/00* (2006.01)
*H01L 27/146* (2006.01)

(52) U.S. Cl.
CPC .......... *G02B 3/00* (2013.01); *B29D 11/00307* (2013.01); *H01L 27/14685* (2013.01)

(58) Field of Classification Search
CPC ................. B29D 11/307; G02B 3/00
See application file for complete search history.

(56) References Cited

U.S. PATENT DOCUMENTS

| | | | |
|---|---|---|---|
| 3,970,362 A * | 7/1976 | Laliberte ................. | G02B 1/04 264/1.32 |
| 5,690,973 A | 11/1997 | Kindt-Larsen et al. .. | 425/436 R |
| 2010/0142061 A1* | 6/2010 | Choi ..................... | B29C 33/305 359/793 |
| 2011/0089590 A1* | 4/2011 | DeCusatis ............... | B29C 33/44 264/2.7 |

(Continued)

FOREIGN PATENT DOCUMENTS

| EP | 2 639 033 A1 | 9/2013 | ............. B29C 39/24 |
|---|---|---|---|
| JP | 2010-214763 A | 9/2010 | ............. B29C 39/36 |

(Continued)

OTHER PUBLICATIONS

International Search Report issued in corresponding International Patent Application No. PCT/EP2012/075015, dated Aug. 26, 2013.

(Continued)

*Primary Examiner* — Matthew J Daniels
*Assistant Examiner* — Kelsey C Grace
(74) *Attorney, Agent, or Firm* — Kushner & Jaffe

(57) ABSTRACT

A device for producing a lens wafer with a plurality of microlenses with an upper die and a lower die for embossing of the lens wafer from a fluid embossing mass which has been delivered between the dies, curing means for curing of the embossed lens wafer, characterized in that at least one release element for detachment of the cured lens wafer prior to curing can be located between the lower die and the upper die.

11 Claims, 4 Drawing Sheets

(56) References Cited

U.S. PATENT DOCUMENTS

2013/0221549 A1* 8/2013 Eguro ................ B29C 35/0888
264/1.7

FOREIGN PATENT DOCUMENTS

| JP | 2010-266666 A | 11/2010 | ............. B29D 11/00 |
| JP | 2012-158110 | 8/2012 | ............. B22D 17/22 |
| WO | WO 2012/063882 | 5/2012 | ............. B29C 39/24 |
| WO | WO 2012/063882 A1 | 5/2012 | ............. B29C 39/24 |

OTHER PUBLICATIONS

Office Action issued in related Japanese Patent Application No. 2015-546862 dated Aug. 22, 2016.

* cited by examiner

METHOD AND DEVICE FOR PRODUCING A LENS WAFER

RELATED APPLICATIONS

This application is a National Stage of International Application No. PCT/EP2012/075015, filed Dec. 11, 2012.

FIELD OF THE INVENTION

This invention relates to a method and a device for embossing, a lens wafer which has a plurality of microlenses.

BACKGROUND OF THE INVENTION

Microlenses are used for devices which require an optical focusing apparatus, such as for example cameras of cell phones. Due to miniaturization pressure, the functional regions will become smaller and smaller. The more the microlenses are miniaturized, the more difficult their optically correct production becomes because, at the same time, there is enormous cost pressure for the microlenses to be produced in mass production.

The optical systems can consist of static and/or dynamic convex or concave lenses. The microlenses are embossed either individually on or in a corresponding carrier substrate, or are part of a monolithic wafer. These monolithic wafers therefore constitute carrier-free lens fields. In this respect, "carrier-free" means that the lenses need not be shaped on their own carrier. The lens material is rather deformed along a corresponding surface by an upper and/or lower die into a lens field which is self-supported. The advancing miniaturization is accelerated by the use of these carrier-free lens fields. Carrier-free lens fields on the one hand offer greater flexibility in optical design of thinner lenses and on the other hand high precision in the production. Furthermore, they are produced in one piece, combine lenses and carriers into one another, can be easily handled, transported and connected to one another. The separation of the lens wafers from the corresponding embossing molds or from the embossing dies represents a major technical problem.

An advantage of this invention is a device and a method with which the detachment of the lens wafer is improved, especially in a fully automatic process.

This advantage is achieved with the features of claims 1 and 5. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

SUMMARY OF THE INVENTION

The invention is based on the concept of arranging at least one release element for detaching the cured lens wafer from the first and/or the second embossing die between the first and second embossing die before curing of the lens wafer. By this measure, the time in placing the embossing mass between the first and second embossing die and/or the time in aligning the first and second embossing die to one another and/or the time in embossing of the embossing mass or in the movement of the embossing dies to one another is used for positioning/arranging at least one release element. In accordance with the invention, it possible to start the detachment of the lens wafer immediately after the curing of the embossing mass. Thus, the device as claimed in the invention and the method as claimed in the invention are especially suitable for monolithic lens wafers.

In other words, the invention is comprised in the following: before original shaping of the lens wafer, a tool, i.e., a release element, is installed between the upper and the lower embossing dies such that in the original shaping of the monolithic lens wafer a positive connection between the originally shaped lens wafer and the tool is formed. By means of the positive connection, it is possible to detach the lens wafer from the lower and/or the upper embossing die.

The invention is therefore especially suitable for use in carrier-free lens wafers.

One advantage of this invention is that the release of a carrier-free lens wafer from the upper and/or lower embossing die can be carried out at least largely without damage and automatically for production designs which are suitable for mass production.

According to one advantageous embodiment of this invention, a release element has an action section with one face side whose outer contour is shaped such that the action section can be located in an unstructured region which is located on the periphery of the lower and/or upper die outside of the lower and/or upper lens molds for original shaping of the microlenses. In this way, the action region which is required for the release element for detachment can be arranged such that the yield of microlenses on the lens wafer is not reduced.

It is advantageous if the release element on the face side, at least in the action section, has an (especially standard) thickness d smaller than the embossing thickness of the lens wafer. The embossing thickness of the lens wafer is less than 2000 µm, preferably less than 1500 µm, even more preferably less than 1000 µm, most preferably less than 500 µm. Here it is preferred if the thickness d is greater than ⅕, preferably greater than ⅓, preferably greater than ½ of the embossing thickness, most preferably greater than ¾ of the lens wafer.

To the extent that at least one lower release element is designed for contact with one peripheral section of the lower die and one upper release element is designed for contact with a peripheral section which is spaced apart, preferably opposite, for detachment of the lens wafer from the upper and lower die, there can be at least one separate release element at a time so that each release element can be ideally positioned opposite the respective die.

In accordance with the present invention, a method for producing a lens wafer comprises the following steps:
  applying an embossing mass to a lower die or a wafer (carrier wafer for the lens wafer and the microlenses), by means of an application apparatus,
  placing at least one release element between the lower and an upper die which is aligned to the lower die,
  embossing of the embossing mass by the upper die (therefore by moving the lower and upper die toward one another),
  curing of the embossing mass, wherein release element is put in place before curing.

It is advantageous if an action section of the release element is located in an unstructured region of the upper die.

Furthermore, it is advantageous for the lens wafer after curing to be detached from the lower and/or upper die by means of the release element.

The curing takes place either thermally and/or by electromagnetic radiation and/or chemically.

In the thermal curing, it is advantageous if the lower and/or the upper die has a correspondingly high thermal conductivity. The thermal conductivity is between 0.01 W/(m*K) and 500 W/(m*K), more advantageously between 1 W/(m*K) and 500 W/(m*K), most preferably between 10 W/(m*K) and 500 W/(m*K), most preferably of all between 100 W/(m*K) and 500 W/(m*K).

In curing by electromagnetic radiation, the upper and/or the lower die is transparent to all wavelengths which lead to curing. Since most materials are cured preferably by UV radiation, the preferred transparency region is between 10 nm and 400 nm. The embodiment by means of electromagnetic radiation represents the embodiment which is preferred.

In chemical curing, the upper and/or the lower die is made such that corresponding chemicals acquire access to the embossing mass. Either by porous dies or by microchannels and/or nanochannels which have been specifically worked into the dies.

The release elements are preferably comprised of a corrosion-resistant, economical, light, high-strength material. The release tools can consist of at least one of the following materials:
  metal
  ceramic
  glass
  graphite
  polymer
  composite materials.

Furthermore, it is advantageous if the release elements have low adhesion properties to the lens material. The release elements, either as a result of their material-specific properties, have low adhesion to the lens material or are coated accordingly with antiadhesion layers. Mainly, organic molecules are well suited for the coating. Fluorine-containing and/or thio-containing organic molecules, for example plastics such as PFPE, are suitable. The coating of the release tools with special antiadhesion layers which can be deposited in monolayers would also be conceivable.

If the release elements are comprised of a thermally very conductive material, the addition of heat for thermal curing via the release elements is also conceivable.

The number of release elements per side is one, preferably two, more preferably three, most preferably four, most preferably of all more than four. The more the number of release elements that are used, the smaller the action sections and/or the distances between the individual adjacent release elements can be; this benefits the bending strength during release.

In one special embodiment, the upper and lower release elements alternate along the periphery, and there can be at least partial overlapping.

In another embodiment, each release element has a corresponding release element which is congruent to the release element, especially flush opposite it, on the respectively opposite side.

To the extent in one embodiment, there are release elements which are at least partially, preferably largely on top of one another or which are oppositely flush, the outside contour of the lens wafer can be modified on the edge for improving the stability and stable release. Therefore, according to one advantageous embodiment there is one modification of the upper and/or lower die by release depressions at all sites at which release tools are to be used. In this way, the lens wafer, without a reduction of its average thickness, is extended by means of the release tools and can be stably detached after the embossing process.

One (especially several) microlens(es) which is (are) produced from the lens wafer by isolation can be regarded as an independent invention.

A lens wafer which is produced by the device as heretofore described and/or the method described can be regarded as an independent invention.

Other advantages, features and details of the invention will become apparent from the following description of preferred exemplary embodiments and using the drawings.

DETAILED DESCRIPTION OF THE PREFERRED EMBODIMENTS

In the figures, the advantages and features of the invention are labeled with these identifying reference numbers according to the embodiments of the invention, components or features with the same function or function of the same action being labeled with identical reference numbers.

Figure 1A:
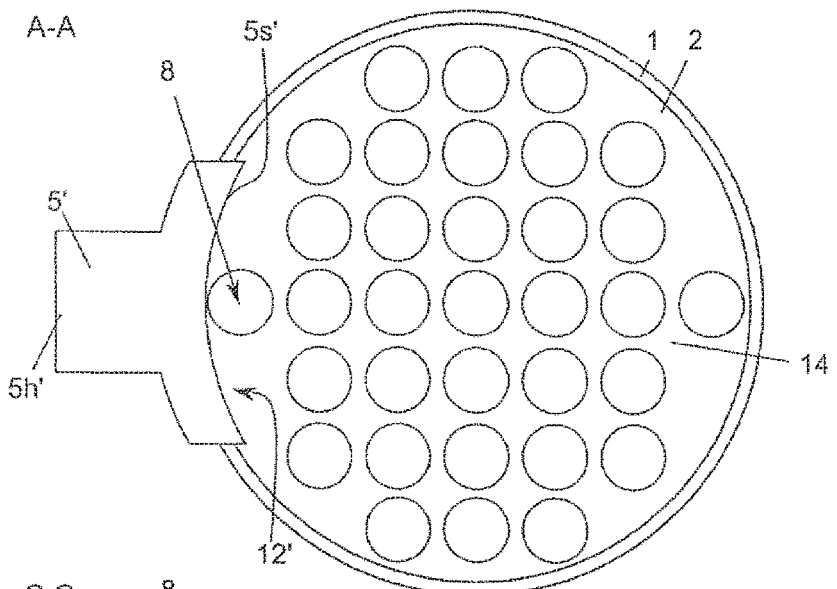
FIG. 1a shows a schematic plan view of an upper die with a release element according to a first embodiment of the invention, viewed along intersection line A-A from FIG. 1b.
Figure 1B:
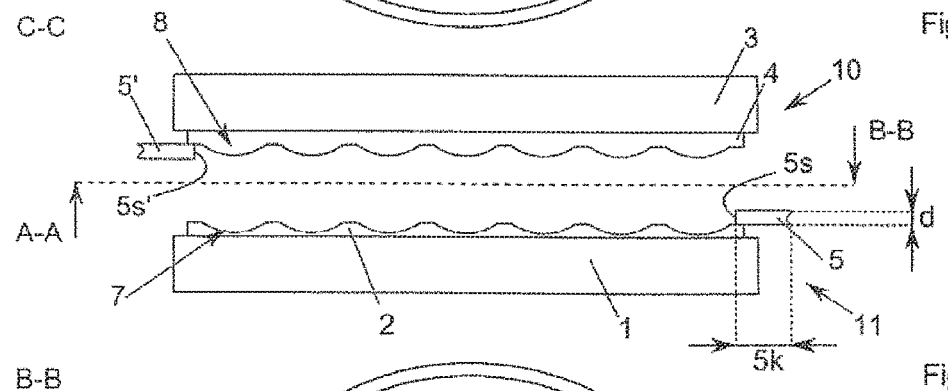
FIG. 1b shows a schematic sectional view of the device according to the first embodiment, viewed along intersection line C-C from FIG. 1c.
Figure 1C:
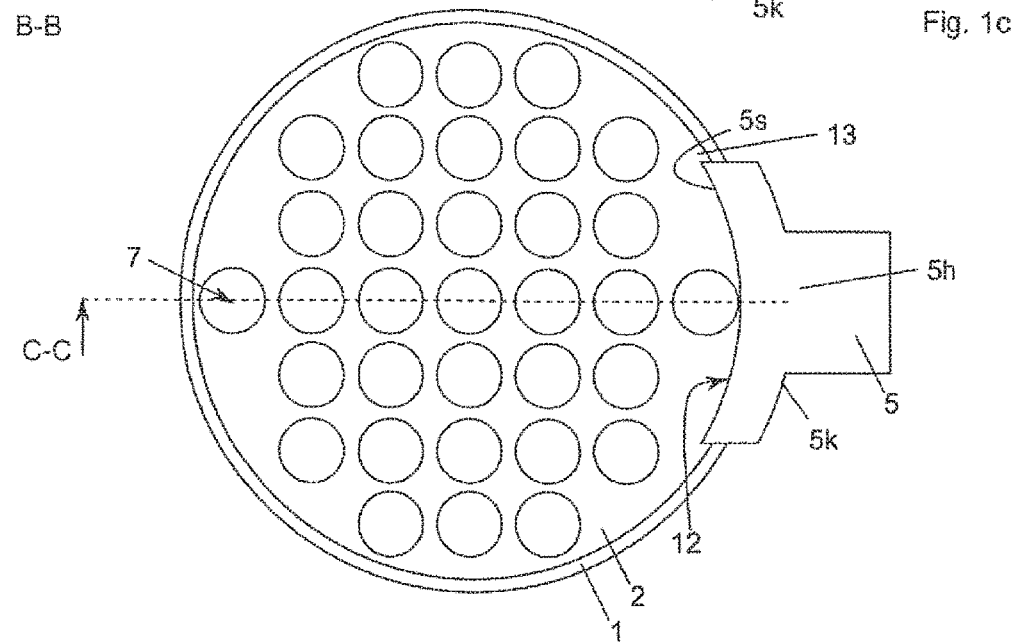
FIG. 1c shows a schematic plan view of the lower die and a release element viewed along intersection line B-B from FIG. 1b.

In the embodiments of this invention, which are shown in FIGS. 1a to 1c, important components of the device are shown while other components of the device are not shown since the configuration of these components is obvious to one skilled in the art or follows clearly from the following description of the function.

According to the present invention, a device has a lower embossing element 11 and an upper embossing element 10, and release elements 5, 5' are assigned to the respective embossing elements 10, 11. The lower embossing element 11 is used to accommodate a lower die 2 on a holding device 1 and the upper embossing element 10 is used to accommodate an upper die 4 on a holding device 3. The lower embossing element 11 and the upper embossing element 10 can be moved relative to one another and means for aligning the upper and lower embossing element 10, 11, are provided and controlled by a control apparatus which is not shown. The holding devices 1 and/or 3 can be any type of fixing for the dies 2 and/or 4. In one special case the holding devices 1 and/or 3 are so-called "back planes" and the dies 2 and/or 4 are undetachably connected to them.

The lower die 2 on its side facing the upper die 4 has a plurality of lower lens molds 7 for shaping/embossing one function surface (optics) of a plurality of microlenses 15 of one lens wafer 6. The upper die 4 on its side facing the lower die 2 has upper lens molds 8 for shaping/embossing a second function surface (optics) of a plurality of microlenses 15. Thus, the upper and the lower dies 2, 4 have an identical number of lens molds 7, 8 with a corresponding arrangement.

The lower die 2 and the upper die 4 outside the low and/or upper lens molds 7, 8 each have an unstructured region 13, 14 which each form essentially one plane which run parallel to one another.

The release elements 5, 5', which are made to be modularly interchangeable, can be moved and aligned relative to the lower and upper dies 2, 4. The release elements 5, 5' have a retaining section 5h, 5h' and an action section 12, 12' which is molded on the retaining section 5h, 5h' and which is located on face sides 5s, 5s' of the release elements 5, 5'. The retaining sections 5h, 5h' are used to hold and move the release elements 5, 5' by positioning apparatus which are not shown, i.e., robot arms. The release elements 5, 5' can also be controlled individually by corresponding drives or preferably can be coupled to one another by simple electrical and/or mechanical machine elements. Purely electrical, mechanical, pneumatic or hydraulic drives are conceivable which assume position control and/or apply the corresponding force in order to carry out release. All release elements can have sensors which are connected to the corresponding drives via a control circuit in order to enable a hardware-controlled and/or software-controlled release.

The face sides 5s, 5s' are especially shaped such that the action sections 12, 12' are made to act on the lens wafers 6 on their unstructured region. Preferably, one release element 5' assigned to the upper die 4 adjoins its periphery, in the unstructured region 14. In particular, another release element 5 assigned to the lower die 2 adjoins its periphery in the unstructured region 13.

The release elements 5, 5' at least in the action sections 12, 12' have a thickness d which is smaller than the embossing thickness D (spacing of the flat unstructured regions 13, 14).

Preferably, the face sides 5s, 5s' extend over one peripheral section of the die 2, 4, preferably less than ¼ of the periphery of the dies 2, 4. In particular, the face sides 5s, 5s' are made to run concentrically to the dies 2, 4.

The inventive function of the release elements 5, 5' is comprised in fixing, stabilizing and/or separating at least one embossed monolithic lens wafer 6 before, during and after embossing/curing.

Figure 2A:
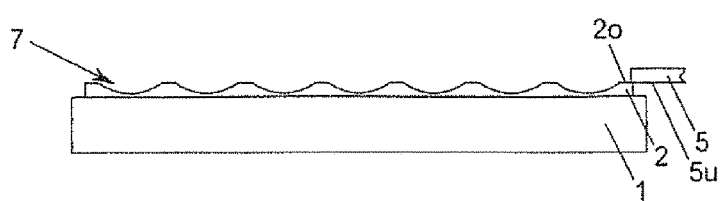
FIG. 2a shows a first method step according to the invention, specifically an arrangement of a lower release element.

In a first process step which is shown in FIG. 2a, the release element 5 which is assigned to the lower die 2 with its bottom 5u is located exclusively over the unstructured region 13 of the lower die 2, and makes contact with it.

Figure 2B:
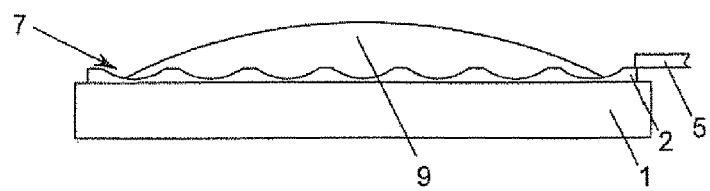
FIG. 2b shows a second method step, specifically application of an embossing mass.

In another process step which is shown in FIG. 2b, an uncured embossing mass 9 is applied to the lower die 2. The application of embossing mass 9 takes place by a dispenser system which is not shown.

Figure 2C:
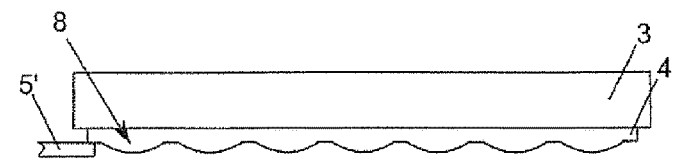
FIG. 2c shows a third method step, specifically an arrangement of an upper release element and arrangement and alignment of the upper die to the lower die.

In a further third process step which is shown in FIG. 2c, the upper die 4 is positioned. The positioning of the two dies 2, 4 relative to one another can take place by corresponding alignment techniques, alignment systems, or purely mechanically. Before embossing of the embossing mass 9 with the upper die 4 (i.e., contacting of the embossing mass 9 by the dies 2, 4) the release element 5' which is assigned to the upper die 4 with its top 5o' is located under the unstructured region 14, and especially makes contact with it.

Figure 2D:
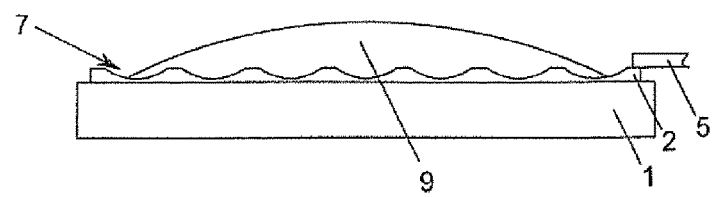
FIG. 2d shows a fourth method step, specifically embossing of the embossing mass.
Figure 2D:
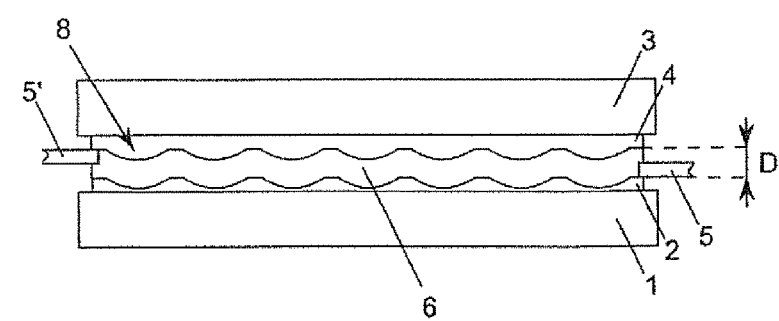

In a fourth process step which is shown in FIG. 2d, a relative approach of the two dies 2, 4 to one another and thus the embossing (original shaping of the lens wafer 6, including curing) follow.

Figure 2E:
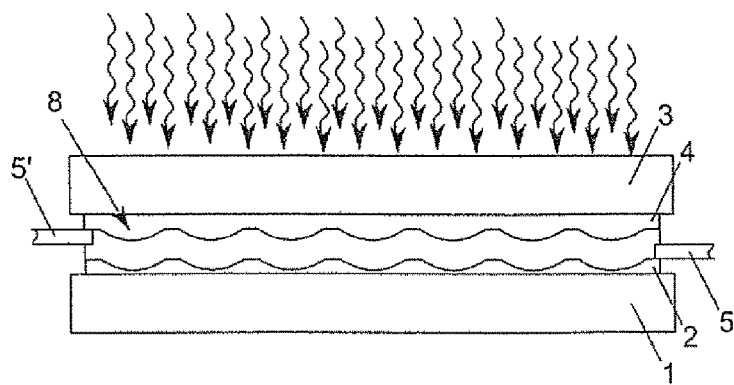
FIG. 2e shows a fifth method step, specifically curing of the embossing mass, especially through the upper die.

In a further process step which is shown in FIG. 2e, the monolithic lens wafer 6 is cured by a hardening process. The curing can take place by all known methods, such as by the way of example and not limitation. Chemically, by electromagnetic radiation or by heat. In the illustrated case, curing takes place by electromagnetic radiation through the upper die 4; this constitutes the preferred embodiment.

Figure 2F:
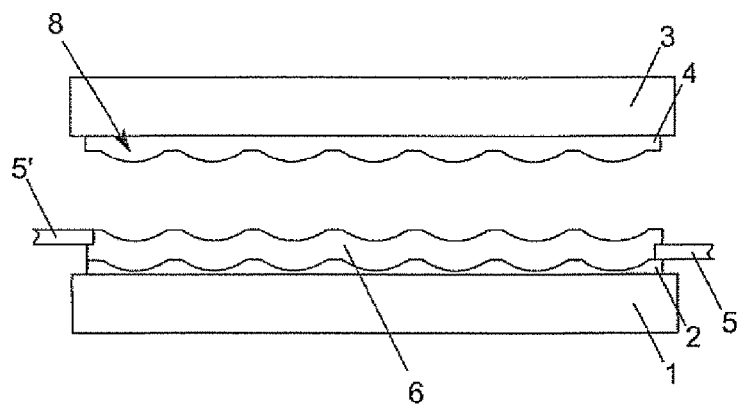
FIG. 2f shows a sixth method step, specifically release of the upper die from the cured lens wafer.

In a further process step which is shown in FIG. 2f, the upper die 4 is moved away from the monolithic lens wafer 6 for release of the die from the monolithic lens wafer 6, by means of the release element 5', which is assigned to the upper die 4, and by means of application of a force which is directed against the movement of the upper die 4 to the lens wafer 6 in the region of the action section 12', the destruction of the lens wafer 6 during detachment is prevented. In this way, detachment is promoted.

Figure 2G:
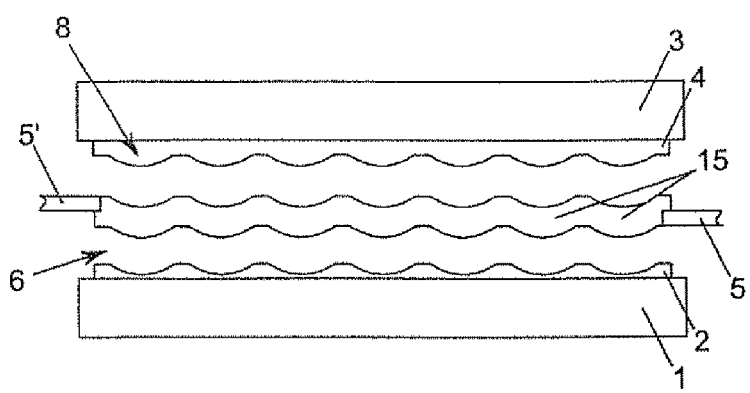
FIG. 2g shows a seventh method step, specifically the release of the lower embossing die from the cured lens wafer.

Analogously, in a further process step which is shown in FIG. 2g, the lower die 2 is released from the monolithic lens wafer 6 by means of the release element 5 which is assigned to the lower die 2.

Figure 2H:
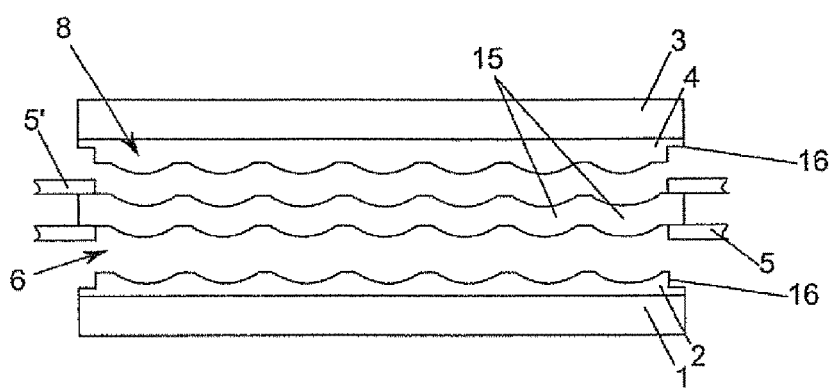
FIG. 2h shows a seventh method step, specifically removal of the lower embossing die from the cured lens wafer, with a second embodiment of the die as claimed in the invention.

To minimize the thickness of the lens wafer 6 with overlapping of the release elements 5, 5', in the preferred embodiment which is shown in FIG. 2h, at least one of the dies 2, 4 has a release depression 16 which corresponds to the shape of the face sides 5s, 5s' of the release elements 5, 5'. Preferably both the upper die 4 and also the lower die 2 have release depressions 16 for all release elements 5, 5' which are distributed on the periphery. In this way, the thickness of the lens wafer 6 remains uniformly distributed on the edge over the periphery so that damage of the lens wafer 6 can be avoided.

The above described processes are controlled via the especially software-supported control apparatus of the device.

Figure 3A:
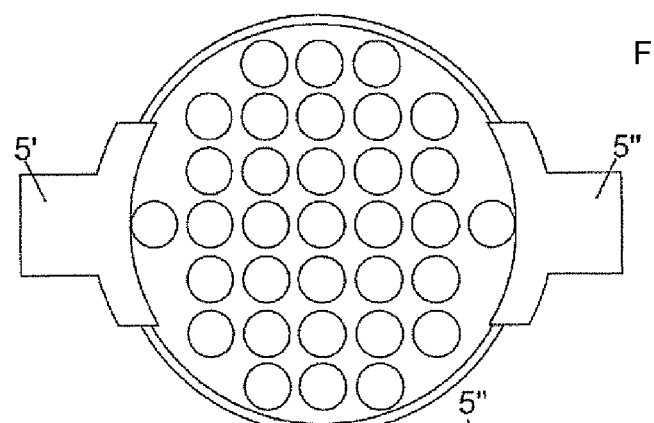
FIG. 3a shows a schematic of a second embodiment of the invention with two release elements.
Figure 3B:
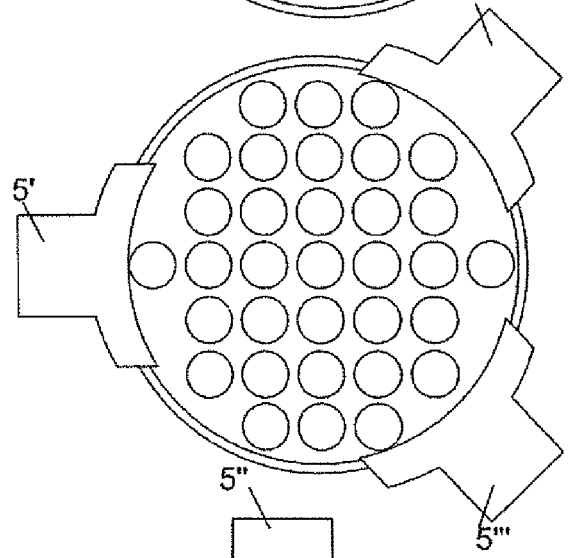
FIG. 3b shows a schematic of a third embodiment of the invention with three release elements and FIG. 3c shows a schematic view of a fourth embodiment with four release elements.
Figure 3C:
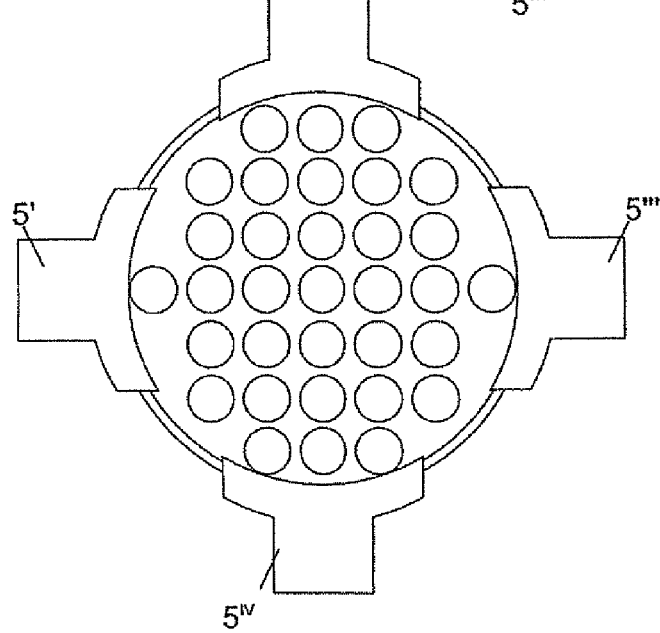

FIGS. 3a to 3c show other embodiments with two, three or four release elements 5, 5', 5", 5'" and $5^{IV}$ which are disposed symmetrically to one another on the periphery of the dies 2, 4. Preferably, at least two release tools per die 2, 4 are used, more preferably at least three, most preferably at least four, most preferably of all more than four.

The release elements 5, 5', 5", 5'" and $5^{IV}$ work analogously to the above described release elements 5, 5'. The release elements 5 to $5^{IV}$ can be fixed in particular relative to the respectively assigned holding devices 1, 3 or dies 2, 4.

Preferably, the release elements which are assigned to the upper die 4 are arranged distributed on the periphery of the dies 2, 4 in a manner complementary to the release elements which are assigned to the lower die 2.

During release, it is conceivable to support the release elements 5, 5', 5", 5'", 5$^{IV}$ by additional support tools and/or to support the detachment of the lens wafer from the lower and/or the upper die 2, 4 on the periphery of the lens wafer 6 distributed in the unstructured region of the lens wafer 6 by means of clamping.

REFERENCE NUMBER LIST

1 holding device
2 lower die
3 holding device
4 upper die
5, 5', 5", 5'", 5$^{IV}$ release elements
5$u$ bottom
5$s$, 5$s'$ face sides
5$h$, 5$h'$ retaining sections
6 lens wafer
7 lower lens molds
8 upper lens molds
9 embossing mass
10 upper embossing element
11 lower embossing element
12, 12' action sections
13 unstructured region
14 unstructured region
15 microlenses
16 release depression
D thickness
D embossing thickness Having described the invention, the following is claimed:

1. A device for producing a lens wafer having a plurality of microlenses, comprising:
   a lower die configured to receive a fluid embossing mass thereon,
   an upper die aligned relative to the lower die, the upper die being configured to emboss the fluid embossing mass on the lower die to form the lens wafer, the upper die being further configured to allow heat, electromagnetic radiation, or chemicals to pass therethrough to cure the formed lens wafer, and
   at least one release element tool installed between the lower and upper dies prior to the forming of the lens wafer, the release element tool being configured to detach the cured lens wafer from said upper and lower dies,
   wherein at least one of the lower die and the upper die comprises a release depression configured to accommodate the release element tool thereon.

2. The device as claimed in claim 1, wherein the release element tool has an action section with a face side having an outside contour shaped such that the action section is located outside of lower and/or upper lens molds in an unstructured region, the unstructured region being located on a periphery of the lower die and/or of the upper die, the lower and/or upper lens molds being configured to shape the microlenses.

3. The device as claimed in claim 2, wherein the release element tool on the face side, at least in the action section, has a thickness (d) less than 2000 μm.

4. The device as claimed in claim 1, wherein the at least one release element tool comprises at least one lower release element tool and at least one upper release element tool, the lower release element tool being configured to contact a peripheral section of the lower die, the upper release element tool being configured to contact a peripheral section of the upper die that is opposite to the peripheral section of the lower die.

5. The device as claimed in claim 1, wherein the upper and/or lower dies is further configured to position the release element tool between the lower and the upper dies.

6. The device as claimed in claim 1, wherein the release element tool is coated with an anti-adhesion layer.

7. The device as claimed in claim 6, wherein the anti-adhesion layer is comprised of fluorine-containing and/or thio-containing organic molecules.

8. The device as claimed in claim 1, wherein the release element tool is further configured to positively connect with the cured lens wafer.

9. A method for producing a lens wafer having a plurality of microlenses, comprising the steps of:
   receiving a fluid embossing mass on a lower die,
   installing at least one release element tool between the lower die and an upper die which is aligned relative to the lower die, the installing comprising accommodating the at least one release element tool on a release depression of at least one of the lower die and the upper die,
   forming the lens wafer, the forming comprising embossing the fluid embossing mass on the lower die by the upper die,
   curing the formed lens wafer, the curing comprising thermally curing, electromagnetically radiating, or chemically curing the formed lens wafer through the upper die, and
   detaching the cured lens wafer from said upper and lower dies using the release element tool,
   wherein the installing occurs prior to the forming.

10. The method as claimed in claim 9, wherein one action section of the release element tool is located in an unstructured region of the upper die.

11. The method as claimed in claim 9, wherein a positive connection between the lens wafer and the release element tool is formed.

* * * * *